US008373542B2

(12) United States Patent
Lee

(10) Patent No.: US 8,373,542 B2
(45) Date of Patent: Feb. 12, 2013

(54) ALL-IN-ONE RADIO FREQUENCY IDENTIFICATION (RFID) SYSTEM FOR SALE AND INVENTORY MANAGEMENT

(75) Inventor: Leo Lee, Hsinchu (TW)

(73) Assignee: Claridy Solutions, Inc., Taipei (TW)

( * ) Notice: Subject to any disclaimer, the term of this patent is extended or adjusted under 35 U.S.C. 154(b) by 336 days.

(21) Appl. No.: 12/755,903

(22) Filed: Apr. 7, 2010

(65) Prior Publication Data

US 2011/0050425 A1 Mar. 3, 2011

(30) Foreign Application Priority Data

Aug. 25, 2009 (TW) ............................... 98215660 U

(51) Int. Cl.

| | |
|---|---|
| ***G05B 19/00*** | (2006.01) |
| ***G05B 1/08*** | (2006.01) |
| ***H04Q 5/22*** | (2006.01) |
| ***G06Q 30/00*** | (2012.01) |
| ***G01R 31/04*** | (2006.01) |

(52) U.S. Cl. .................... 340/5.91; 340/5.92; 340/568.8; 340/539.22; 340/10.1; 235/385; 324/538

(58) Field of Classification Search .... 340/572.1–572.9, 340/5.91, 5.92, 568.8; 235/385
See application file for complete search history.

(56) References Cited

U.S. PATENT DOCUMENTS

| | | | | |
|---|---|---|---|---|
| 4,827,395 | A * | 5/1989 | Anders et al. | 700/9 |
| 5,241,277 | A * | 8/1993 | Kefalas | 324/538 |
| 2004/0046020 | A1* | 3/2004 | Andreasson et al. | 235/385 |
| 2009/0027202 | A1* | 1/2009 | Copeland et al. | 340/572.1 |
| 2009/0224875 | A1* | 9/2009 | Rabinowitz et al. | 340/5.53 |

* cited by examiner

*Primary Examiner* — Jennifer Mehmood
*Assistant Examiner* — Fekadeselassie Girma
(74) *Attorney, Agent, or Firm* — WPAT PC; Justin King

(57) ABSTRACT

This is an all-in-one radio frequency identification system for goods inventory and sale management, comprising at least one tag, an antenna unit and a multi-port reader comprising a micro control unit, a reader and a multiplexer. The tag is attached on each article. The antenna unit is RF coupled to the tag. The multiplexer built-in the multi-port reader is electrically coupled to the antenna unit. The reader built-in the multi-port reader is capable of transmitting RF signals, accessing commands and receiving tag signals from the multiplexer. The micro control unit is electrically coupled to the multiplexer and the reader to receive and process the reading signal and provide inventory and sale management functions and applications. Therefore, the all-in-one radio frequency identification system provides not only inventory and anti-theft functions but also information for consumer behavior research, and capable of doing stand alone operations.

12 Claims, 4 Drawing Sheets

ALL-IN-ONE RADIO FREQUENCY IDENTIFICATION (RFID) SYSTEM FOR SALE AND INVENTORY MANAGEMENT

FIELD OF THE INVENTION

The present invention generally relates to an all-in-one radio frequency identification (RFID) system for the requirements of inventory and sale management with a micro control unit (MCU), a reader and a multiplexer built in to provide not only inventory and anti-theft functions but also the information regarding the product as well as the take-away frequency of each product for consumer behavior research. Furthermore, the present invention can do stand-alone operation without a host computer while the built-in MCU receive and process the RF (radio frequency) signals and show the relevant information on the display with the embedded inventory program of the all-in-one RFID device.

BACKGROUND OF THE INVENTION

RFID technology functions as a data collection method by wirelessly transmitting RF (Radio Frequency) signals between the reader and the tag. The tracing feature of RFID technology makes it applicable in various requirements like warehouse management, sale and inventory management, vehicle tracking, identification and so on.

As for the sale and inventory management, it usually adapts anti-theft devices such as anti-theft chains or anti-theft locks for security purposes.

However, these kinds of devices with its large size and appearance are not suitable for high-priced small articles such as jewelry, handset devices, cosmetics and luxuries. Besides, the anti-theft device is typically controlled by the staff so it is difficult to avoid human mistakes. On the other hand, it always spends a lot of time on stocktaking tasks because of the large scale or complicated categories of the stock. As a result, the present invention provides a solution to address the security and stocktaking issues under the stand-alone device, with the architecture easy to implement and operate to reduce cost and human errors. Moreover, the present invention further assists the sales people to manage sale related matters and helps the marketing specialists capable of analyzing the consumers and the markets regarding the product under the all-in-one system herein.

SUMMARY OF THE INVENTION

From the perspective mentioned above, the present invention offers an all-in-one RFID system for the requirements of sale and inventory management comprises a multi-port reader with a micro control unit (MCU), a reader and a multiplexer built in it, at least one antenna unit and one tag. The present invention provides not only inventory and anti-theft functions but also displays information of the products and records consumer behavior for marketing analysis.

First of all, the micro control unit (MCU) built in the multi-port reader of the all-in-one RFUD system is electrically coupled to the multiplexer as well as the reader to receive and process the RF (radio frequency) signals which makes the device an all-in-one system. Then, the reader is capable of transmitting RF signals, accessing commands and receiving tag signals; the multiplexer is electrically coupled to the external antenna units and capable of switching antenna signals; the antenna units RF coupled to the tag attached on each article. Lastly, there is an inventory program embedded in the micro control unit (MCU) to provide the inventory, anti-theft, sale assistant function and records for marketing analysis.

BRIEF DESCRIPTION OF THE DRAWINGS

The objects and spirits of the embodiments of the present invention will be readily understood by the accompanying drawings and detailed descriptions, wherein.

DETAILED DESCRIPTION OF THE PREFERRED EMBODIMENT

The present invention can be exemplified but not limited by various embodiments as described hereinafter.

Figure 1:
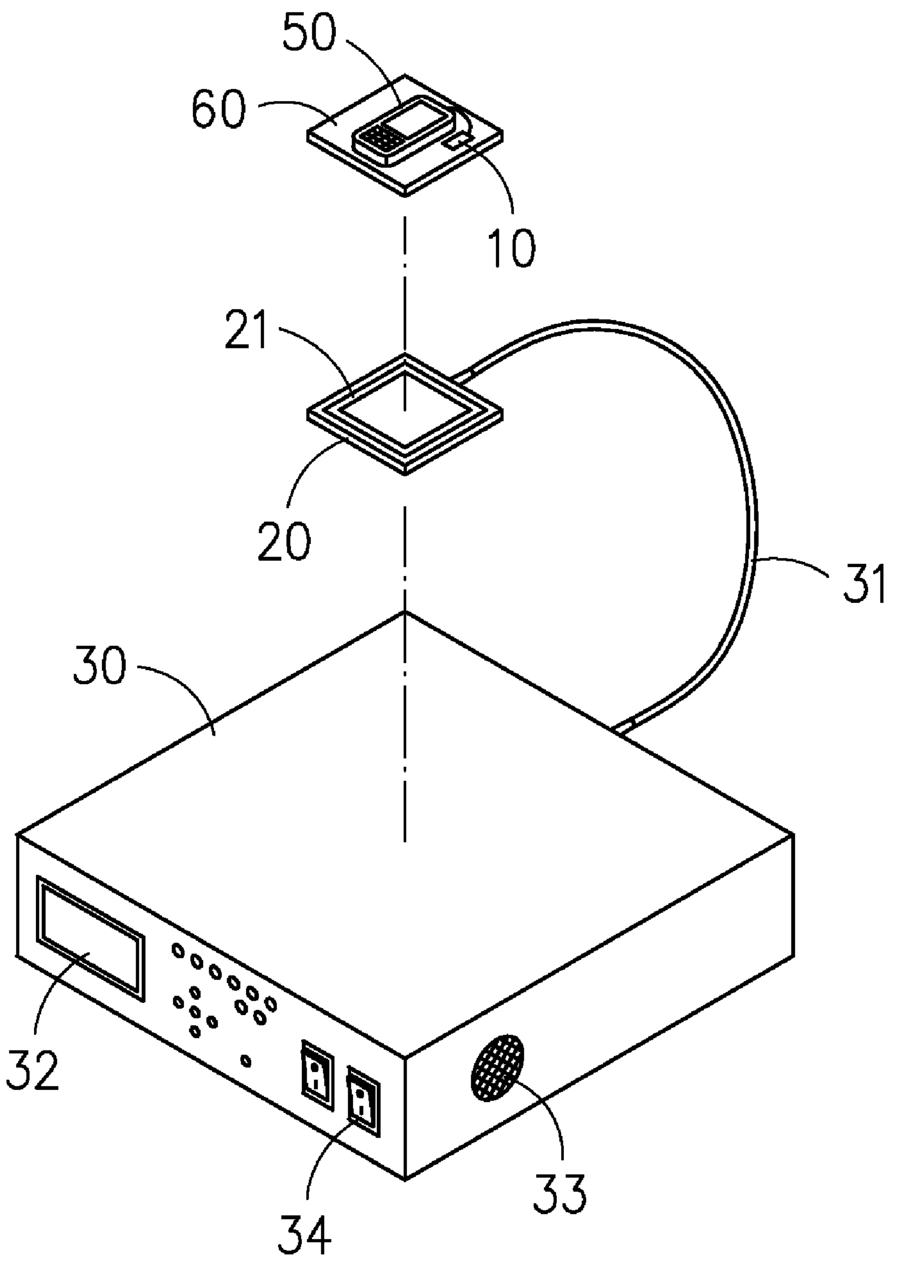
FIG. 1 is an exploded view of an RFID system according to a first embodiment of the present invention.
Figure 3:
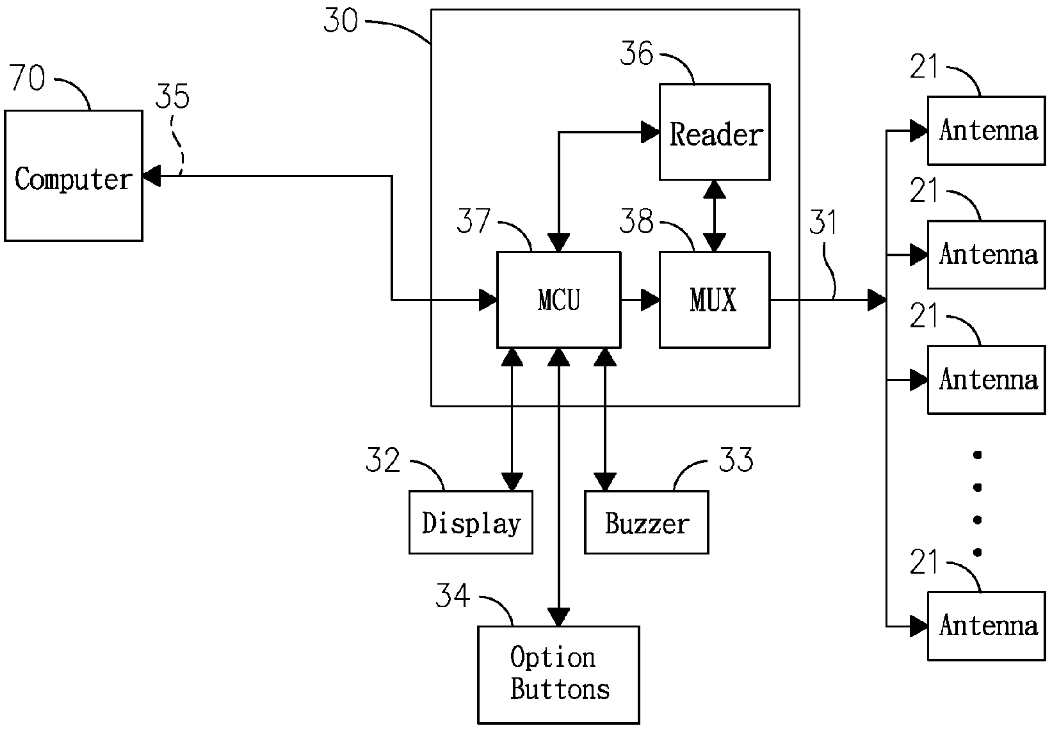
FIG. 3 is a block diagram of an RFID system according to a second embodiment of the present invention.

Please refer to FIG. 1, which is an exploded view of an all-in-one RFID system for sale and inventory management according to the first embodiment of the present invention. The RFID system comprises a tag 10, an antenna unit 21 and a multi-port reader 30. The tag 10 is attached on the article 50. The article 50 is placed on an exhibition platform 60. The antenna unit 21 is RF coupled to the tag 10 wirelessly. The multi-port reader 30 is electrically coupled to the antenna unit 21 via the RF cable 31. The exhibition platform 60 and the antenna unit 21 can be arranged on the multi-port reader 30. The multi-port reader 30 comprises at least one display 32, at least one buzzer 33, at least one control button 34. The display 32 can be either monochrome or multi color such as a LED or a LCD. Moreover, the multi-port reader 30 comprises at least one micro control unit (MCU) 36, a reader 37, and a multiplexer (MUX) 38 (as shown in FIG. 3). The reader 37 is capable of transmitting RF signals, accessing commands and receiving tag 10 signals.

Figure 2:
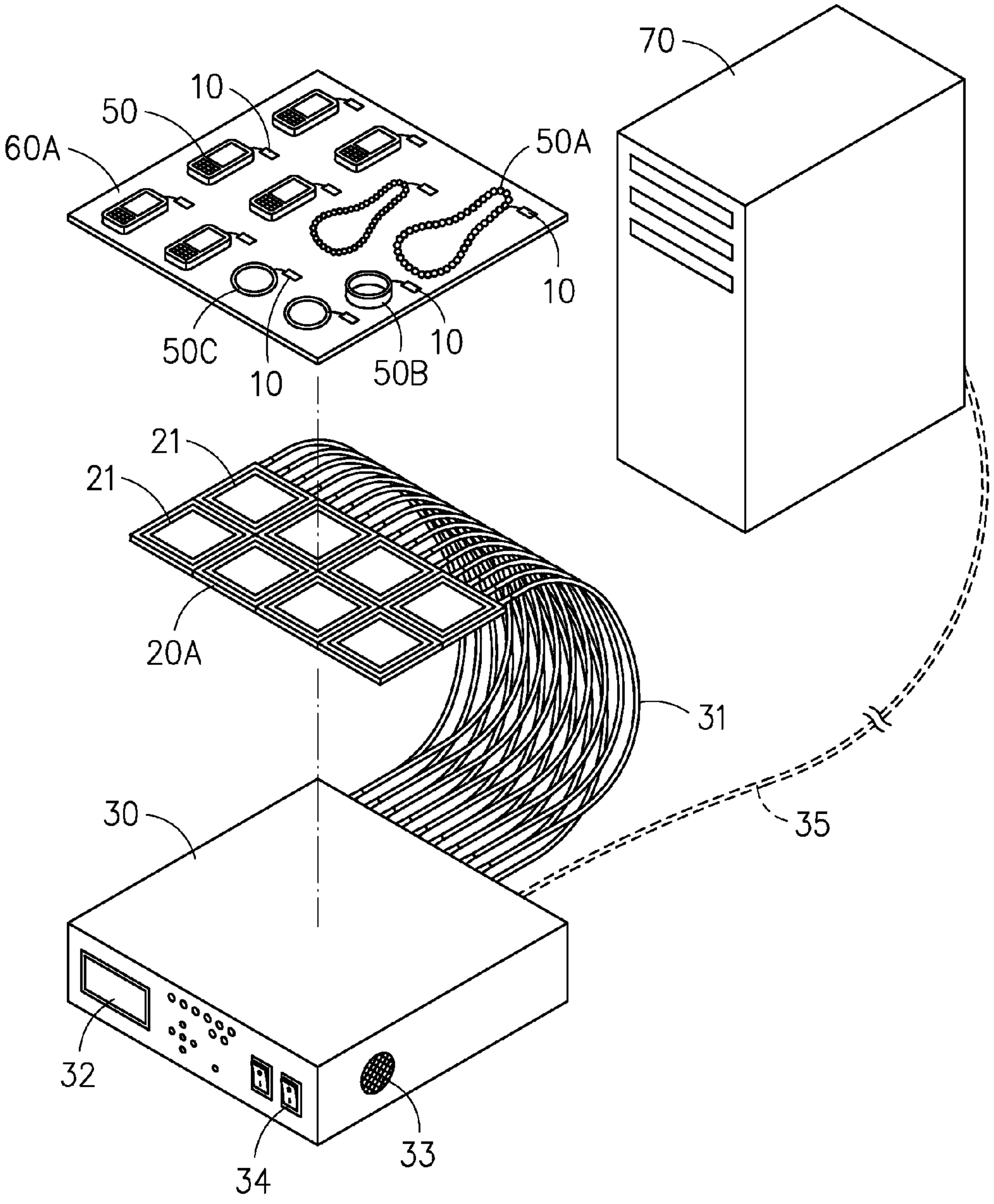
FIG. 2 is an exploded view of an RFID system according to a second embodiment of the present invention.
Figure 4:
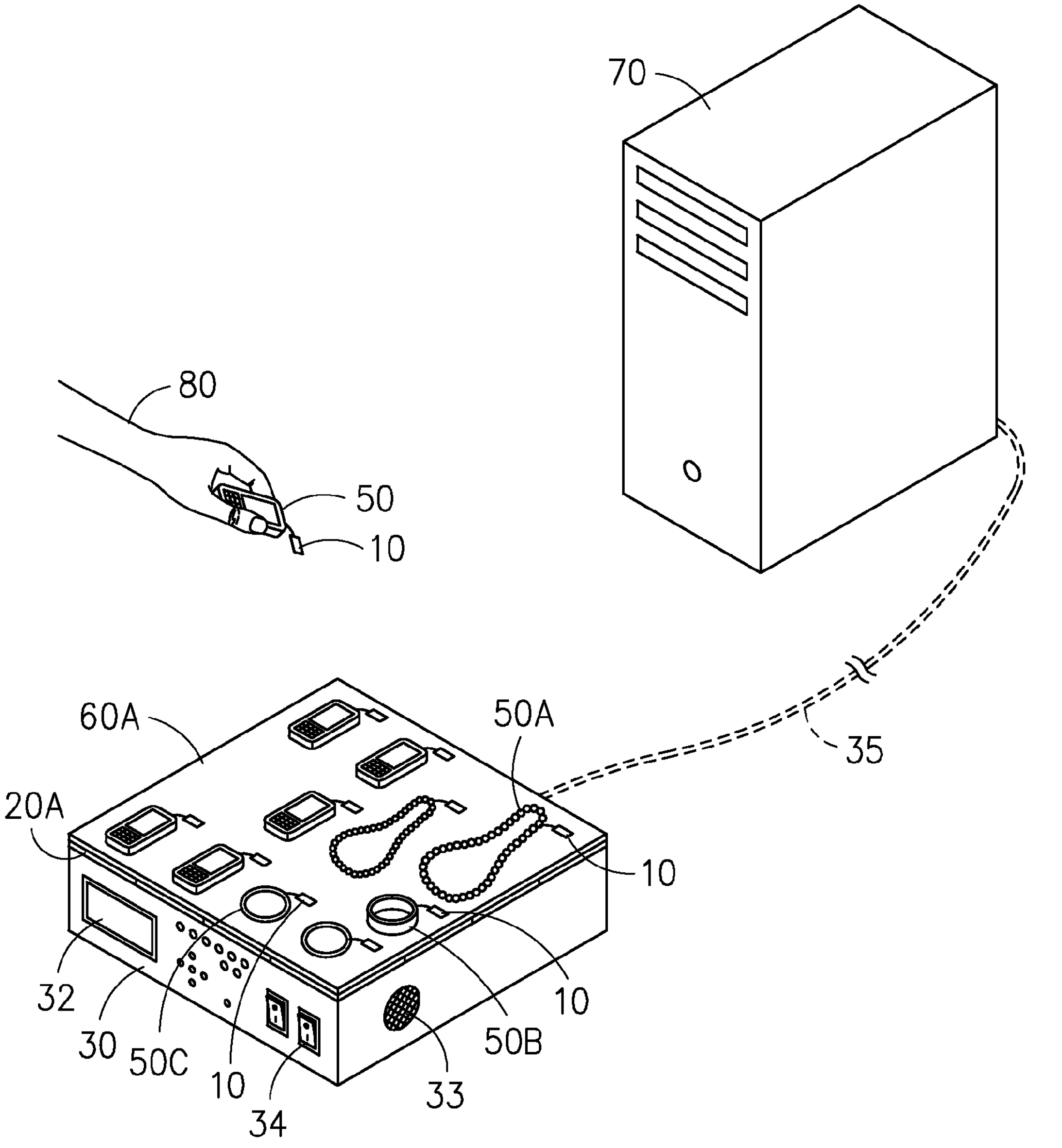
FIG. 4 shows an application an RFID system according to a second embodiment of the present invention.

To extend the RFID system for applications of sale and inventory management, please refer to FIG. 2 to FIG. 4 for the second embodiment of the present invention. The extended RFID system comprises a number of tags 10, multiple antenna units 21 and the multi-port reader 30 comprising a micro control unit (MCU) 37, a reader 36 and a multiplexer (MUX) 38 embedded therein. A number of tags 10 are respectively attached on a number of articles 50, 50A, 50B and 50C. The articles 50, 50A, 50B, 50C are exhibited on a large exhibition platform 60A. Similarly, the exhibition platform 60A and the antenna units 21 can be arranged on the multi-port reader to integrate into a single device (as shown in FIG. 4). The antenna units 21 are RF coupled to the tags 10. The multi-port reader 30 is electrically coupled to the antenna units 21 via a number of RF cables 31. Since there are eight independent antennas 21 in the embodiment, eight RF cables 31 are required. The multi-port reader 30 comprises at least one reader 36 being capable of transmitting RF signals, accessing commands and receiving tag 10 signals. The multi-port reader 30 can do stand alone operations with the micro control unit (MCU) accompany an inventory program to provide inventory, anti-theft and sale assistant functions. However, the user can also connect the multi-port reader 30 to a computer system 70 via a connection 35 for further data research, remote monitoring or other applications based on the practical use. The multi-port reader 30 can be connected to the computer system 70 via the signal cable 35. The signal cable 35 can be compatible with serial or parallel interfaces, such as Ethernet, RS-232, and so on.

In FIG. 4, the exhibition platform 60A, the antenna units 21 and the multi-port reader 30 can be integrated as one so that the antenna units 21 are embedded in the exhibition platform 60A to reduce the size as well as the thickness.

The present invention is not limited to the above descriptions. The RFID system can be operated with low-frequency (LF), high-frequency (HF), ultra-high-frequency (UHF), or microwave frequency band. The reader 30 may comprise a multiplexer (MUX) 38 to increase the number of antennas (for example, eight independent antennas 21 in the embodiment in FIG. 2) to enlarge the reading area. The signal cables 31 can be provided with SMA, TNC, MMCX, IPEX or RCA connectors. The MCU 37 can be compatible with serial or parallel interfaces, such as 12C, UART, SPI, etc.

The inventory program embedded in the present invention is capable of providing the anti-theft function, setting the secure time of the articles and issuing the alarm while the article is undetected over the preset time interval; inventory management, displaying the actual number of the articles on the exhibition platform in real time; setting to show the information of the product for sale assistant function while the sales people can query the product information by pressing the corresponding control button, and moreover, recording the take-away frequency of each product for consumer behavior analysis and marketing surveys. According to the embodiment in FIG. 4, the present invention has advantages such as:

1. All-in-one total solution: Since the micro control unit (MCU) 37 built in the multi-port reader owns a microprocessor, a computer is not required for the RFID system of sale and inventory management to have an all-in-one and stand-alone device. Besides, the multi-port reader 30 with a multiplexer (MUX) 38 built in can connect with multiple antennas 21 to increase the reading area and reduce the hardware cost. The system can also do real-time inventory. For example, as the article 50 in FIG. 4 is taken away from the exhibition platform 60A by a customer 80, the display would show the actual number of the items on the platform 60A as well as the information of the article which is taken away to support the sales people for promoting the product and help the customer to comprehend the product. Moreover, it can record the take-away frequency to do consumer behavior research and marketing analysis. On the other hand, for the anti-theft function, the buzzer 33 also built in the multi-port reader 30 and will issue an alarm while the items are undetected over the preset time interval for the security function.

2. Innovative services: The RFID system of the present invention provides the jewelry sales people with real-time inventory information to reduce time and effort on inventory management. The RFID system of the present invention provides anti-theft function to help the sales people to prevent the articles from being taken away without permission. Moreover, the RFID system also helps the sales people to promote an item by displaying information of the product. The main controller embedded an inventory program to report the take-away frequency of each product and help the marketing people to do consumer behavior analysis. Moreover, the RFID system can be extended to comprise more antennas for practical use. Therefore, the RFID system is applicable in larger area. Unlike the conventional single antenna reader, the RFID system of the present invention can be built up with lower cost, simplified setup procedures and more flexibility.

3. Diversity of applications and implementations. The RFID system of the present invention provides real-time inventory information of high-priced small articles such as jewelry, handset devices, cosmetics and luxuries. For a jewelry seller, the RFID system can be installed in the jewelry showcase to provide all-in-one selling solutions. In other words, the seller can demonstrate the jewelry and do real-time inventory management at the same time. Therefore, the RFID system reduces the burdens of the seller by providing diverse functions such as the anti-theft function, setting the secure time of the articles and issuing the alarm while the article is undetected over the preset time interval; inventory management, displaying the actual number of the articles on the exhibition platform in real time; setting to show the information of the product for sale management while the sales people can query the product information by pressing the corresponding control button, and moreover, recording the take-away frequency of the products for consumer behavior analysis and marketing surveys. The RFID system can also be installed in a safe deposit box or the display counter in the retail to provide the real-time information such as the quantities of the jewelries, luxuries or pharmaceuticals of each shelf therein the cabinet. Moreover, the RFID system can further do batches inventory by utilizing a tunnel type mechanism, each batch is put into the tunnel to do inventory, so that the staff can simplify the inventory process and have better efficiency by reducing the inventory time and also lowering the labor cost for the managers.

Accordingly, the all-in-one RFID system for inventory and sale management of the present invention uses RFID antennas embedded in or arranged on the exhibition platform and tags attached onto each article, the information of which is then processed by the micro control unit (MCU) for sale and inventory management. Besides, the display of the multi-port reader would show valuable information of the product for the sales people and the customers. The RFID system of the present invention also provides anti-theft function for sellers to sell high-priced small articles such as jewelry, handset devices, cosmetics and luxuries and records consumer behavior for marketing analysis. Therefore, the present invention is practical, original and prominent.

Although this invention has been disclosed and illustrated with reference accelerometer to particular embodiments, the principles involved are susceptible for use in numerous other embodiments that will be apparent to persons skilled in the art. This invention is, therefore, to be limited only as indicated by the scope of the appended claims.

What is claimed is:

1. An all-in-one RFID system for sale and inventory management of products and articles, comprising:

at least one antenna unit, each antenna unit being radio frequency (RF) coupled to at least one tag attached and corresponding to a respective article for sale and inventory management; and a multi-port reader comprising:

a multiplexer, electrically coupled to each of the antenna units, configured for selectively switching signals between the antenna units;

a reader, electrically coupled to the multiplexer, configured for transmitting RF signals, accessing commands, and receiving tag signals;

a micro control unit (MCU), electrically coupled to the multiplexer and the reader, configured to provide inventory and sale management functions and applications;

at least one display, electrically coupled to the MCU, configured for outputting information of the all-in-one RFID system in real time;

at least one buzzer, electrically coupled to the MCU, configured for generating sound; and at least one control button to control the at least one buzzer, the at least one display, or data input;

wherein, the micro control unit further comprises a memory, for which at least one inventory program stored in the memory provide functions as real-time inventory, product information displaying, consumer behavior recording and anti-theft functions.

2. The all-in-one RFID system of claim 1, wherein the RFID system can be operated with low-frequency (LF), high-frequency (HF), ultra-high-frequency (UHF), or microwave frequency band.

3. The all-in-one RFID system of claim 1, wherein the RFID system is installed in various instruments selected from the group including a jewelry showcase, safe deposit box, retail counter and stocktaking tunnels for batch inventory operations.

4. The all-in-one RFID system of claim 1, wherein the at least one display is either monochrome or multi-color for showing the quantities of the items for real-time inventory management and the product information to assistant the sales people and service the customers.

5. The all-in-one RFID system of claim 1, wherein the at least one buzzer is configured to generate alarm sound for the anti-theft function to help the sales people protect and monitor the products for security purposes.

6. The all-in-one RFID system of claim 1, wherein the micro control unit comprises at least one inventory program is configured for sending commands to the reader to do real-time inventory and show the information on the display in real-time.

7. The all-in-one RFID system of claim 1, wherein at least one inventory function is configured for recording the take-away frequency of the products to do consumer behavior analysis.

8. The all-in-one RFID system of claim 1, wherein at least one inventory function is configured for setting the take-away secure time of the product for security purposes.

9. The all-in-one RFID system of claim 1, wherein at least one inventory function is configured for running an internal diagnostic to alert the sales people via buzzer when a product is taken away over the preset time interval.

10. The all-in-one RFID system of claim 1, wherein at least one inventory function is configured for setting customized product information for displaying enabling sales people or consumers to query a particular product by pressing the corresponding control button.

11. The all-in-one RFID system of claim 1, wherein the multi-port reader comprises at least one multiplexer which is electrically coupled to at least one of the antenna units via RF cables or PCB board.

12. The all-in-one RFID system of claim 1, wherein a RF cable connected with the multiplexer includes SMA, TNC, MMCX, IPEX or RCA connectors.

* * * * *